(12) United States Patent
Masumoto et al.

(10) Patent No.: US 6,583,483 B2
(45) Date of Patent: Jun. 24, 2003

(54) SEMICONDUCTOR DEVICE AND ITS MANUFACTURING METHOD (75) Inventors: Kenji Masumoto, Hiji (JP); Mutsumi Masumoto, Beppu (JP); Akira Karashima, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/909,340

(22) Filed: Jul. 19, 2001

(65) Prior Publication Data

US 2002/0050653 A1 May 2, 2002

(30) Foreign Application Priority Data

Jul. 26, 2000 (JP) .......................................... 2000-224975

(51) Int. Cl.[7] .............................................. H01L 31/00
(52) U.S. Cl. ........................ 257/459; 257/676; 257/786
(58) Field of Search ........................ 257/459, 779–784, 257/786, 56, 58, 62, 65, 676; 438/48, 612, 614, 617, 666, 123

(56) References Cited

U.S. PATENT DOCUMENTS 5,296,744 A * 3/1994 Liang et al. ................. 257/784
6,291,898 B1 * 9/2001 Yeh et al. .................... 257/690
6,316,838 B1 * 11/2001 Ozawa et al. ............... 257/686

* cited by examiner

Primary Examiner—David Nelms
Assistant Examiner—Long Tran
(74) Attorney, Agent, or Firm—Michael K. Skrehot; Wade James Brady, III; Frederick J. Telecky, Jr.

(57) ABSTRACT

In semiconductor device 10 under this invention, bonding pads 20 are lined up in a staggered pattern on the main surface of semiconductor chip 14 which is mounted on insulated substrate 12. Multiple stud bumps are stacked on top of the pads 20a which are located on the inner rows, and these stud bumps comprise stud bump stack 28. Conductive wire 22 connects the lands 18 on the insulated substrate with the corresponding bonding pads 20. The wire is formed with its beginning at the land and its end at the bonding pad. Via the stud bump stacks 28, the ends of conductive wire 22a on the inner pads are in a higher position than the ends of conductive wires 22b on the outer pads, so that the problem of neighboring conductive wires coming into contact does not occur.

18 Claims, 8 Drawing Sheets

SEMICONDUCTOR DEVICE AND ITS MANUFACTURING METHOD

TECHNICAL FIELD OF THE INVENTION

This invention pertains to a semiconductor device and a method of manufacturing such device that utilizes a conductive wire bonding technique, and specifically pertains to a semiconductor device and a method of manufacturing such device that is appropriate to the purpose of reducing the thickness of such device package.

CROSS-REFERENCES TO RELATED APPLICATIONS (None)

BACKGROUND OF THE INVENTION

Prior Art

The widespread use of mobile computers and cellular telephones in recent years has accelerated the miniaturization and heightened functionality of these products, and as a result the need has arisen for the semiconductor devices installed in these products to be further miniaturized and heightened in functionality. These kind of demands on semiconductor devices increase the number of input/output channels per unit surface area as well as narrow the pitch between bonding pads on the internal semiconductor chip.

Generally, bonding pads on a semiconductor chip are located in a single row, lined up at the edges of the main surface of the semiconductor chip (known as in-line rows). However, if the pitch between bonding pads is narrowed as discussed above, when the conductive wire is to be bonded to the bonding pads, the tip of the capillary that supplies the wire comes into contact with the conductive wire on top of the neighboring bonding pad. At this point, in existing processes, so-called staggered rows, where neighboring bonding pads are located alternately on the inner side and outer side of the edge of the main surface of the semiconductor chip, have come to be employed in conjunction with the miniaturization and heightening in functionality of the above semiconductor chip.

On the other hand, in conductive wire bonding methods, there is also a technique known as reverse bonding, wherein opposite to ordinary bonding procedure, bonding is carried out first on the wiring and inner lead portions on the substrate to which the semiconductor chip is mounted (hereinafter "land"), and after that the end of the conductive wire is bonded to the bonding pad on the semiconductor chip. An advantage of reverse bonding is that it reduces the thickness of the semiconductor package, since reverse bonding does not require a protuberance of the conductive wire on top of the bonding pad.

Problem to be Solved by the Invention

However, a problem when employing reverse bonding is that the pitch between the bonding pads cannot be narrowed as much as it can when employing ordinary bonding. In other words, in reverse bonding, during the bonding process, the conductive wire is pressed down on the bonding pad, changing its shape, before the capillary is pulled up. As a result, after severing it, the edge of the conductive wire is fanned out in a semicircular shape extending beyond the region of the bonding pad, and there is a danger that this could come into contact with a neighboring conductive wire. This problem cannot be avoided even when using the above staggered rows as the positioning for the bonding pads.

Accordingly, an objective of this invention is to provide for a semiconductor device and a method of manufacturing such a semiconductor device that allows for reduction of the pitch between bonding pads similar to that obtainable when employing ordinary bonding, while utilizing a reverse bonding process.

SUMMARY OF THE INVENTION

This invention pertains to a semiconductor device that employs reverse bonding technique. A semiconductor device embodying this invention is comprised of a semiconductor chip comprised of multiple bonding pads located in staggered rows on its edges; a substrate mounted with the above semiconductor chip and comprised of multiple lands connected electrically to the above multiple bonding pads; a bump portion formed on top of a bonding pad as above that is located on the inner side of the above semiconductor chip; a first conductive wire wherein the beginning is connected to a land as above and the end is connected to a bonding pad as above that is located on the outer side of the above semiconductor chip; a second conductive wire wherein the beginning is connected to a land as above and the end is connected to a bump as above on a bonding pad as above located on the inner side of the above semiconductor chip; and resin affixing the above semiconductor chip, a first conductive wire as above, and a second conductive wire as above.

A semiconductor device embodying this invention is also comprised of a semiconductor chip comprised of multiple bonding pads located in staggered rows on its edges; multiple lands connected electrically to the above multiple bonding pads; a bump portion formed on top of a bonding pad as above that is located on the inner side of the above semiconductor chip; a first conductive wire wherein the beginning is connected to a land as above and the end is connected to a bonding pad as above that is located on the outer side of the above semiconductor chip; a second conductive wire wherein the beginning is connected to a land as above and the end is connected to a bump as above on a bonding pad as above located on the inner side of the above semiconductor chip; and resin affixing the above semiconductor chip, a first conductive wire as above, and a second conductive wire as above.

The above semiconductor device may be further equipped with a second semiconductor chip, and the above land may be comprised of bonding pads formed on top of the other semiconductor chip. Also, the above semiconductor device may be further equipped with a lead frame, and the above land may be formed on the inner lead portion of the lead frame.

In the semiconductor device discussed above, it is preferable that the above bump portion on a bonding pad as above located on the inner side of the above semiconductor chip is a stud bump stack that stacks two or more stud bumps. Also, it is preferable that the height of the above bump portion be 60 microns or more from the front surface of the above semiconductor chip.

This invention also provides for other semiconductor devices that employ reverse bonding technique. Such semiconductor devices are comprised of a semiconductor chip comprised of multiple bonding pads located in staggered rows on its edges; a substrate mounted with the above semiconductor chip and comprised of multiple lands connected electrically to the above multiple bonding pads; a first conductive wire wherein the beginning is connected to a land as above and the end is connected to a bonding pad as above that is located on the outer side of the above semiconductor chip; a second conductive wire wherein the beginning is connected to a bonding pad as above located on the inner side of the above semiconductor chip and the end is connected to a land as above; and resin affixing the above semiconductor chip, a first conductive wire as above, and a second conductive wire as above.

This invention also provides for a method of manufacturing semiconductor devices that employ reverse bonding technique. A method for manufacturing a semiconductor device pertaining to this invention is comprised of a process for affixing a semiconductor chip comprised of multiple bonding pads located in staggered rows on its edges onto an insulated substrate comprised of multiple lands connected electrically to the above multiple bonding pads; a process for forming a bump portion on top of a bonding pad as above located on the inner side of the above semiconductor chip; a process for connecting a land as above with a bonding pad as above located on the outer side of the above semiconductor chip with a first conductive wire, with beginning at the above land and the end at the above bonding pad located on the outer side of the above semiconductor chip; a process for connecting a land as above with the above bump portion on a bonding pad as above located on the inner side of the above semiconductor chip, with the beginning at the above land and the end at the above bump portion of a bonding pad as above located on the inner side of the above semiconductor chip; and a process of affixing with resin the above semiconductor chip, a first conductive wire as above and a second conductive wire as above.

In the process of forming the above bump portion, the above bump portion may also be formed by stacking two or more stud bumps on the above bonding pad located on the inner side of the above semiconductor chip.

EXPLANATION OF REFERENCED NUMERALS

10 Semiconductor device
12 Isolated substrate
14 Semiconductor chip
16 Resin molding
18 Land
20 Bonding pad
20a Inner side pad
20b Outer side pad
22 Conductive wire
24 Solder ball
26, 30 Stud bumps
28 Stud bump stack
50 Capillary
52 Ball

DETAILED DESCRIPTION OF THE PREFERRED EMBODIMENTS

Figure 1:
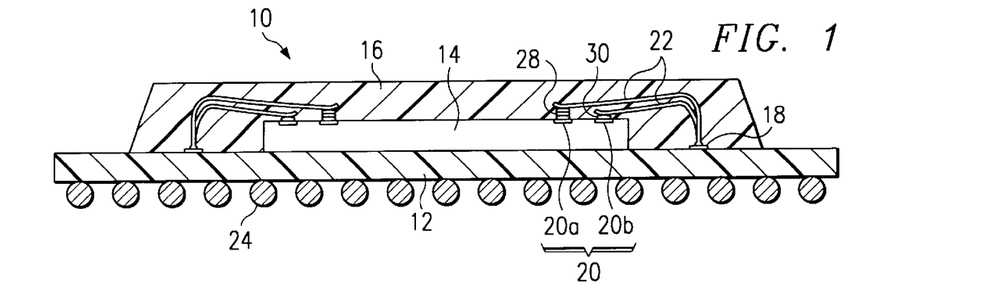
FIG. 1 Cross-section of a BGA type semiconductor device pertaining to the first preferred embodiment of this invention FIG. 2 Enlarged cross-section of principal section of FIG. 1

The following explains the preferred embodiment for this invention with reference to the figures. FIG. 1 is a rough cross-section of a BGA type semiconductor device comprised of the conductive wire bonding structure of this invention. Semiconductor device 10 is structured by mounting semiconductor chip 14 onto insulated substrate 12, and affixing it with resin molding 16. On top of insulated substrate 12, wiring is formed that includes land 18 as the connection terminal for conductive wire 22. On top of semiconductor chip 14, multiple bonding pads 20 are formed, and these are located in staggered rows along the edges of the main surface of the chip. On each bonding pad 20, stud bump 28 or 30 as discussed below are formed. Each bonding pad 20 on semiconductor chip 14 and each land 18 are connected through conductive wire 22 according to the bonding wire technique discussed below. The wiring on top of insulated substrate 12 is connected to solder ball 24 as the external connection end via a through hole (not illustrated) on top of insulated substrate 12.

Figure 2:
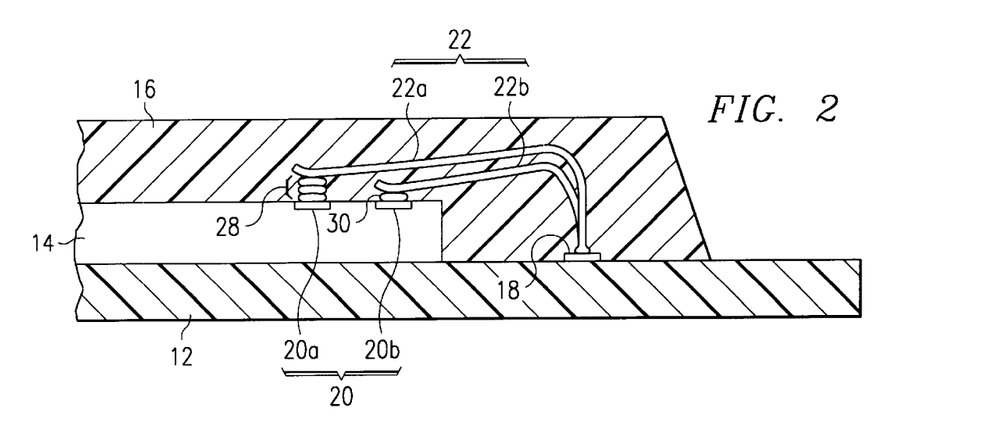
Figures 3, 4:
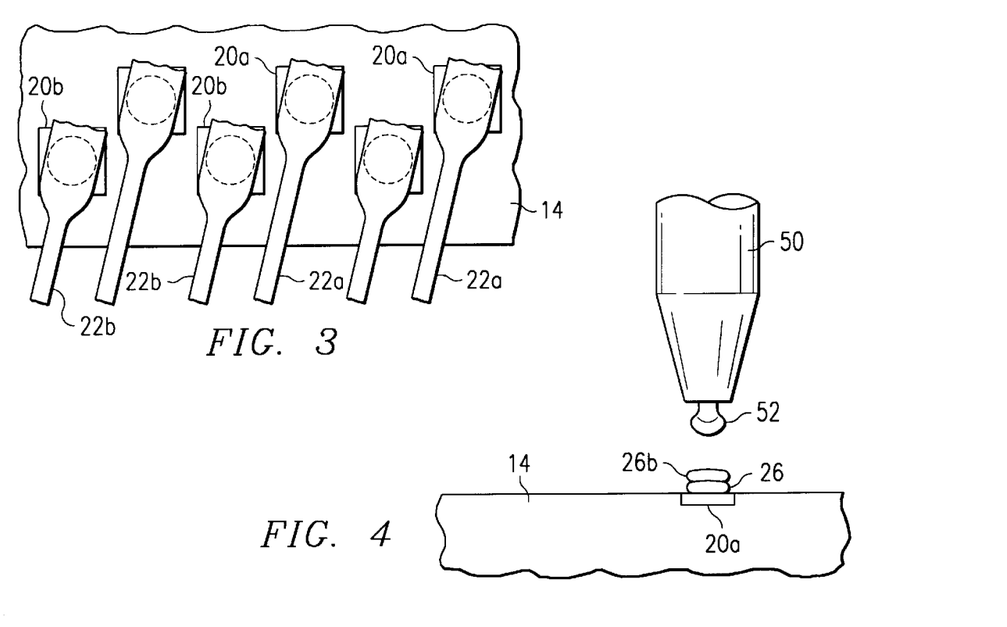
FIG. 3 Enlarged reverse view of principal section of FIG. 1
FIG. 4 Explains stud bump formation process

FIGS. 2 and 3 are a cross-section and a reverse view of the principal section that illustrates the wire bonding structure of the BGA type semiconductor device illustrated in FIG. 1. The bonding structure of conductive wire 22 as it relates to bonding pad 20 on semiconductor chip 14 is specifically described in these figures. As illustrated in these figures, on the main surface of semiconductor chip 14, bonding pads 20 are located in staggered rows, namely lined up alternately in inner and outer rows, along the edges of the semiconductor chip 14. In the following explanations, the bonding pads located at the inner side of the semiconductor chip are called inside pad(s) 20a and the bonding pads located at the outer side are called outside pad(s) 20b.

In this invention, stud bump stacks 28 comprised of multiple stacked stud bumps 26 are on top of inner pads 20a. In the preferred embodiment illustrated in these figures, stud bump stack 28 has been structured by stacking three stud bumps 26. Conductive wire 22a that extends from land 18 is bonded to this stud bump stack 28. As explained below, the end of conductive wire 22a is flattened down and fanned out on top of stud bump stack 28. As is clear from the figure, the objective of forming stud bump stack 28 on top of inner pad 20a is to keep the height of conductive wire 22a which is bonded here above the height of the end of conductive wire 22b which is bonded to outside pad 20b, in order to avoid the termini of the neighboring conductive wires coming into contact with each other or with the end of neighboring conductive wire 22 which has a capillary bonded to its tip.

In the preferred embodiment, a single stud bump 30 is formed on top of outside pad 20b. Then, the end of conductive wire 22b is connected to the top of it. In terms of the objective of this invention, it is preferable that the height of the bonding of conductive wire 22b in relation to outside pad 20b be as low as possible, but it is also preferable to form stud bump 30 on outside pad 20b as shown in the preferred embodiment in order to ensure a good connection of the conductive wire end.

As discussed above the end of conductive wire 22 is bonded to me top or stud bump 28 or 30 for each bonding pad 20. In other words, in a reversal of ordinary bonding procedure, the beginning of conductive wire 22 is bonded onto land 18 on the insulated substrate, and then pulled out and separated by bonding to stud bump 28 or 30. In this type of reverse bonding technique, the rising protuberance of conductive wire 22 is formed above land 18, and does not need be located above the main surface of semiconductor chip 14, so that the thickness of the resin molding 16 as it is formed by covering the top of semiconductor 14 can be decreased. Even insofar as stud bump stack 28 is formed on inner pad 20a, in this invention the height of the end of conductive wire 22 will not be much higher than its apex, so the above advantages still apply.

FIG. 4 illustrates the method for forming stud bump stack 28 on inside pad 20a. Capillary 50, which is used when forming the conductive wire, is also used in the forming of the stud bump. The ball 52 at the tip of the conductive wire being supplied by capillary 50 is severed and dropped successively on top of bonding pad 20a to form stud bump stack 28. In other words, heating and melting the tip of the conductive wire extruded from the tip of the capillary causes surface tension that forms ball 52. Capillary 50 is lowered to the top of inside pad 20a, and ball 52 is press down at this point flattening it slightly, and by then pulling it up the conductive wire is separated from capillary 50 and stud bump 26 is formed. Similarly, on top of the stud bump 26 that is formed, stud bump 26b and the stud bumps provided by ball 52 are stacked successively. In current stud bump formation technology it is possible to stack three to six stud bumps. In an ideal example of this embodiment, at least three stud bumps would be stacked, to a height of 60 microns or more above the main surface of the semiconductor chip.

Figure 5A:
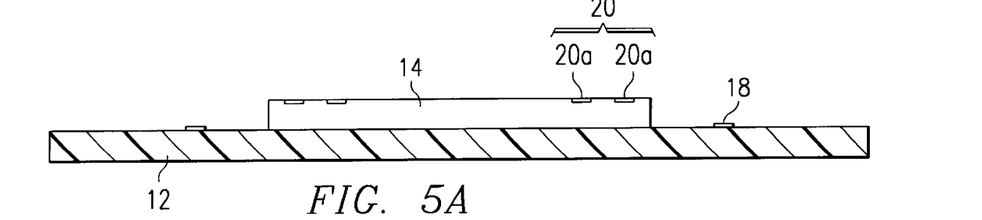
FIG. 5 Illustrates a semiconductor manufacturing process pertaining to a first preferred embodiment of this invention FIG. 6 Illustrates a semiconductor manufacturing process pertaining to a first preferred embodiment of this invention FIG. 7 Illustrates a semiconductor manufacturing process pertaining to a first preferred embodiment of this invention FIG. 8 Rough diagram of an example of the bonding technique of this invention used in connecting two semiconductor chips FIG. 9 Cross-section of a BGA type semiconductor device pertaining to the second preferred embodiment of this invention FIG. 10 Enlarged cross-section of principal section of FIG. 9

FIGS. 5A through 7C show the wire bonding process for this invention. Prior to the assembly of a BGA type semiconductor device, an insulated substrate 12 for mounting the semiconductor chip is prepared. Copper and other metal wiring including lands 18 are placed on insulated substrate 12, and through holes (not illustrated) are formed for the purpose of achieving connection of this wiring with solder ball 24. In FIG. 5A, semiconductor chip 14 is affixed to a specific position on insulated substrate 12 via an adhesive coated on to the back surface of semiconductor chip 14. In an ideal example of this embodiment, insulated substrate 12 would be supplied in the form of polyimide or other flexible insulated film, and multiple semiconductor chips 14 would be mounted continuously at this point.

Figure 5B:
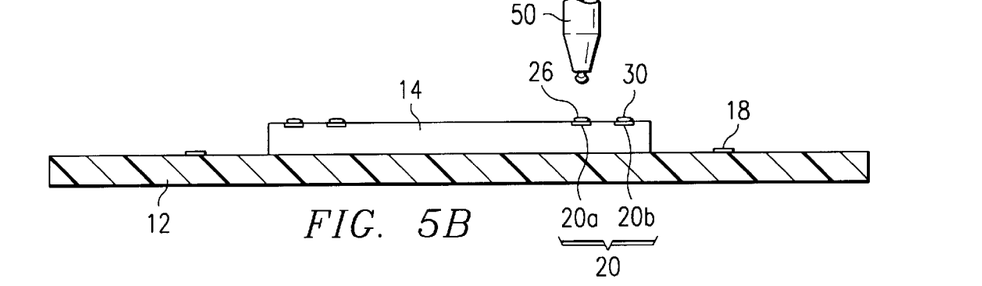
Figure 5C:
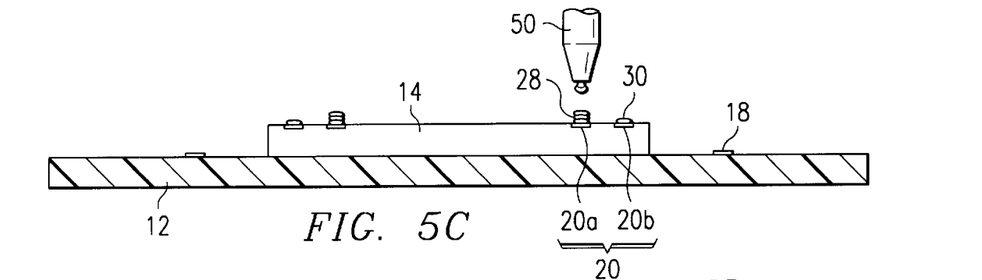

Next, in FIGS. 5B and 5C, stud bumps 26 and 30 are formed using capillary 50. Firstly, in FIG. 5B, one level of stud bumps 26 and 30 are formed on top of all the bonding pads 20. Next, in FIG. 5C, an additional number of stud bumps are stacked on top of stud bumps 26 which have been formed on inner pads 20a, and at this point stud bump stack 28 is formed. The formation of these stud bumps takes place successively through the method explained previously in connection with FIG. 4.

Figure 6A:
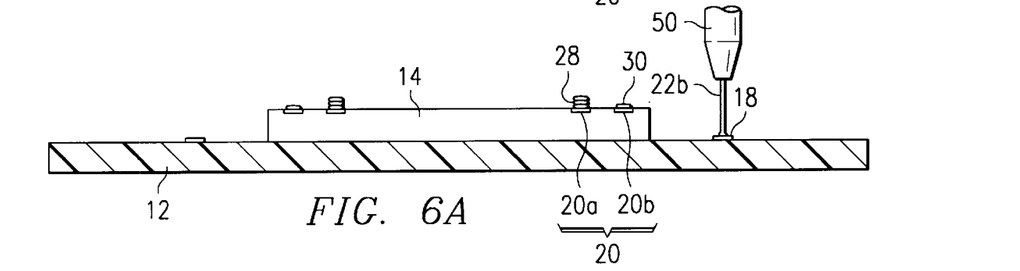
Figure 6B:
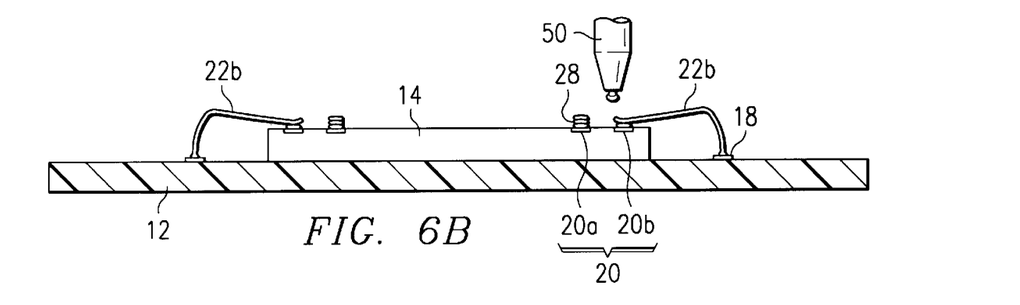

Next, the bonding process that connects outside pads 20b with lands 18 is performed. In FIG. 6A, capillary 50 is lowered onto land 18 and the ball at the tip of conductive wire 22b is pressed down, then after rapidly pulling capillary 50 up to a prescribed height, a loop is described and capillary 50 is then moved to the corresponding outside pad 20b. Capillary 50 is pressed down on top of stud bump 30 which has been formed on outside pad 20b to slightly flatten conductive wire 22b, and then pulled up so that conductive wire 22b is separated from capillary 50. This is performed successively on the outside pads 20b which correspond to the lands 18 (in other words, every other bonding pad), until the initial bonding process is completed, as illustrated in FIG. 6B.

Figure 6C:
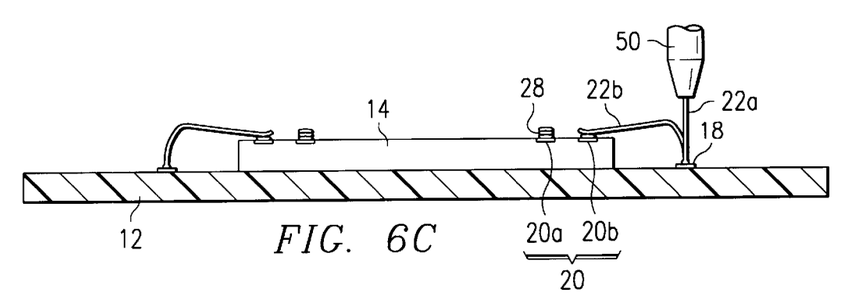

Next, the bonding process to connect the remaining bonding pads, namely inside pads 20a with lands 18 is performed. In FIG. 6C, the bonding process between inside pads 20a and the corresponding lands 18 is performed successively using capillary 50. In other words, a bonding process is performed, with the land 18 side being the beginning of conductive wire 22a and the top of the stud bump stack 28 that has been formed on the corresponding inside pad 20a being the end. At this time, the height of stud bump stack 28 to which the end of conductive wire 22a is bonded is in a higher position than the end position of the conductive wire 22b that has previously been bonded onto outside pad 20b. For this reason, when conductive wire 22a is bonded onto inner pad 20a, contact between the tip of capillary 50 and/or the end of the conductive wire connected this way and the termini of conductive wires 22b on neighboring outside Dads 20b is avoided In this process, the apex of conductive wire 22a which is bonded to land 18 and inside pad 20a is formed so as to be higher than the apex of conductive wire 22b which is bonded to land 18 and outside pad 20b in this way, by varying the heights of the apices of neighboring conductive wires 22, the possibility of contact between neighboring conductive wires 22 is decreased. As illustrated FIG. 7A, all the bonding of conductive wires 22 in relation to the bonding pads 20 is completed through the above processes.

Figure 7A:
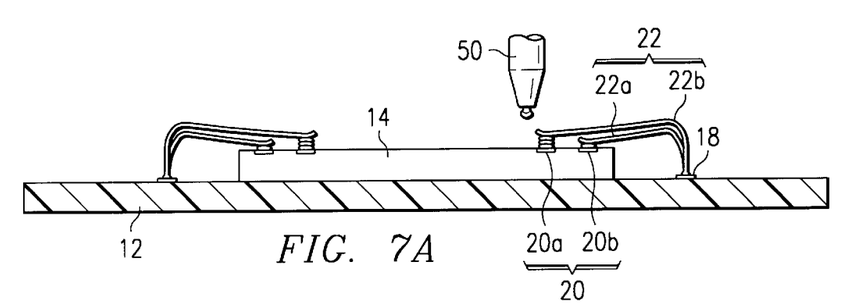
Figure 7B:
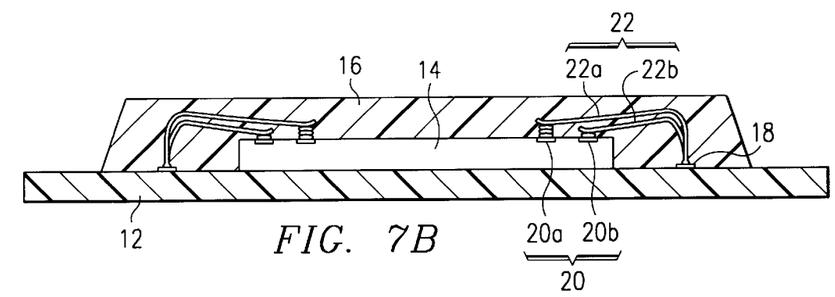
Figure 7C:
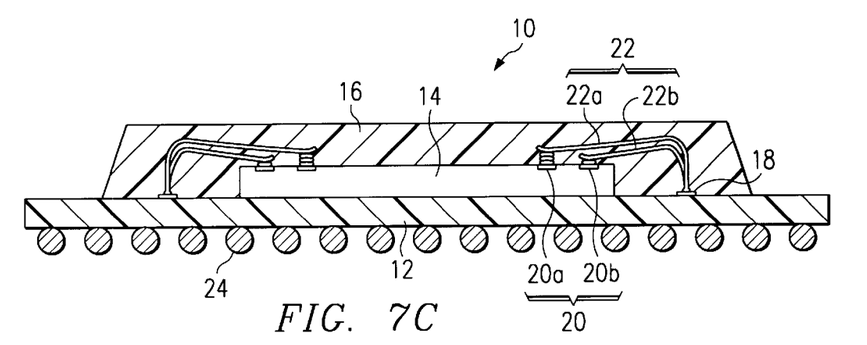

Subsequent to the above bonding process in FIG. 7A, in FIG. 7B, insulated substrate 12 which has been mounted with semiconductor chip 14 is placed in the form of film as is into the mold. Then, through the introduction of resin molding 16 into said mold, the entire outline region of the surface of the insulated substrate including semiconductor chip 14 and conductive wire 22 is covered, and the external shape of the semiconductor package 10 is formed. As discussed above, based on this invention, the height of the conductive wire 22 from the main surface of the semiconductor chip 14 in relation to the surface of the insulated substrate 12 can be lowered, so that the thickness of the semiconductor package 10 formed by resin molding 16 can be decreased. After that, in FIG. 7C solder balls 24 are moved to the position of the through holes on the back surface of the insulated substrate as the external connection terminal, and affixed after reflow. After that, using a punch tool, the package is punched out from the insulated film, and ultimately semiconductor device 10 is obtained.

Figure 8A:
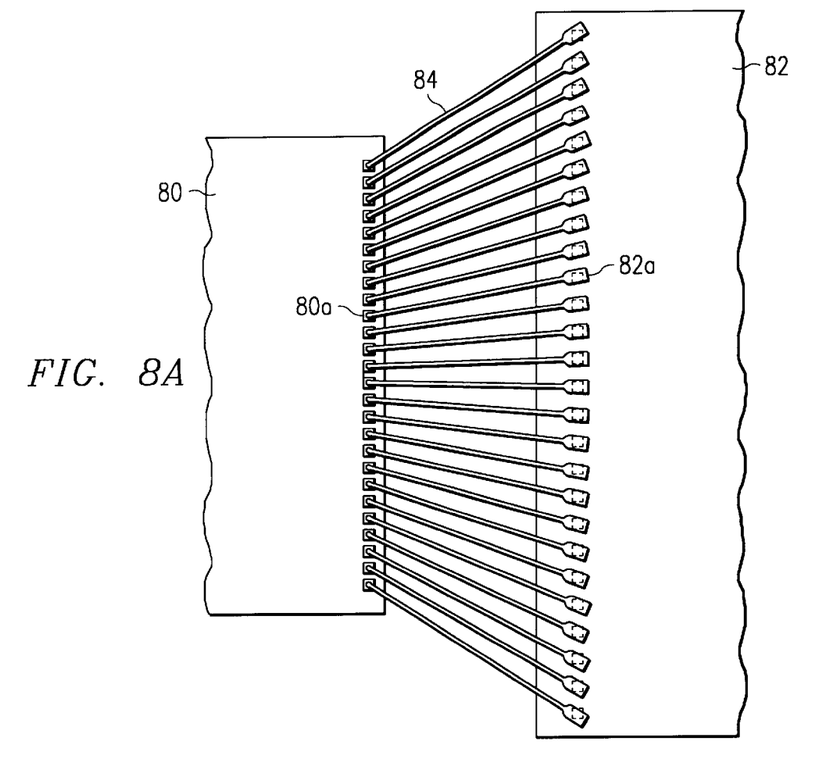
Figure 8B:
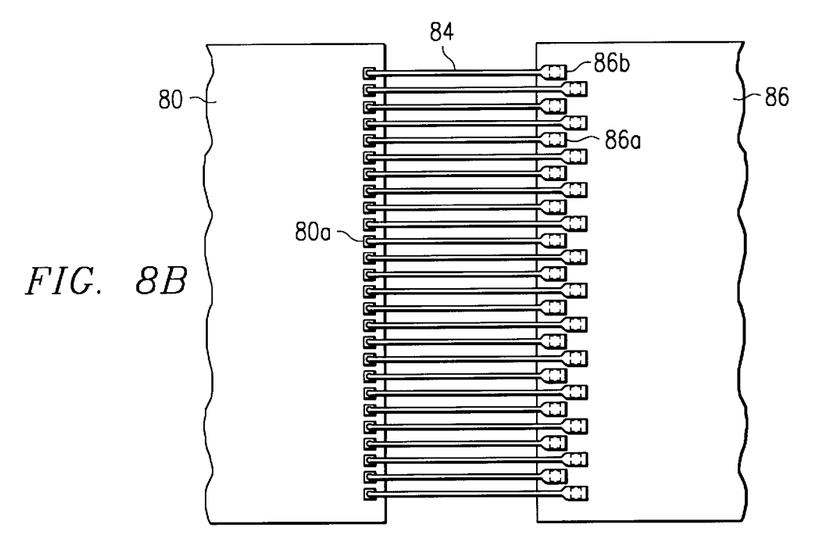

Next, FIGS. 8A and 8B show the advantages of using the bonding method pertaining to this invention to connect two semiconductor chips. FIG. 8A shows what is obtained using existing technology, and FIG. 8B shows what is obtained using this invention. In the existing technology in FIG. 8A, when connecting two semiconductor chips 80 and 82 with conductive wire 84, the pitch between the bonding pads 82a on semiconductor chip 82 which is connected to the end of conductive wire 84 must be sufficiently broader than the pitch between bonding pads 80a on the semiconductor chip that connects to its beginning. This is so as to guarantee that, as previously explained, even when the end of conductive wire 84 is flattened and fanned out as it is severed, it will not come into contact with the end of neighboring conductive wires 84. Because it is necessary in this way to broaden the pitch between bonding pads, semiconductor chip 82 which is connected to the end of conductive wire 84 must be a larger size semiconductor chip.

On the other hand, when employing the bonding method of this invention as shown in FIG. 8B to connect semiconductor chips 80 and 86, the pitch between bonding pads 86a and 86b on semiconductor chip 86 which is the end of conductive wire 84 can be equal to the pitch between bonding pads 80a on semiconductor chip 80 at the beginning of conductive wire 84. In other words, due to the stud bump stack on top of inside pad 86a, the height position of the end of neighboring conductive wire 84 is different and so the termini of said conductive wires 84 will not come into contact even if they are flattened and fanned out.

Figure 9:
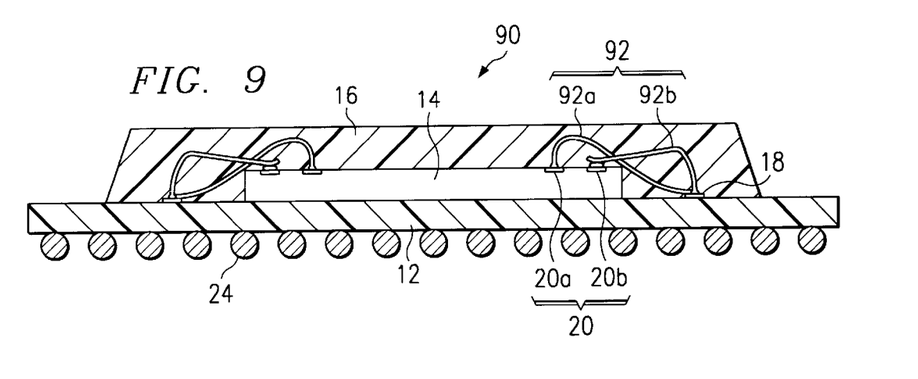
Figure 10:
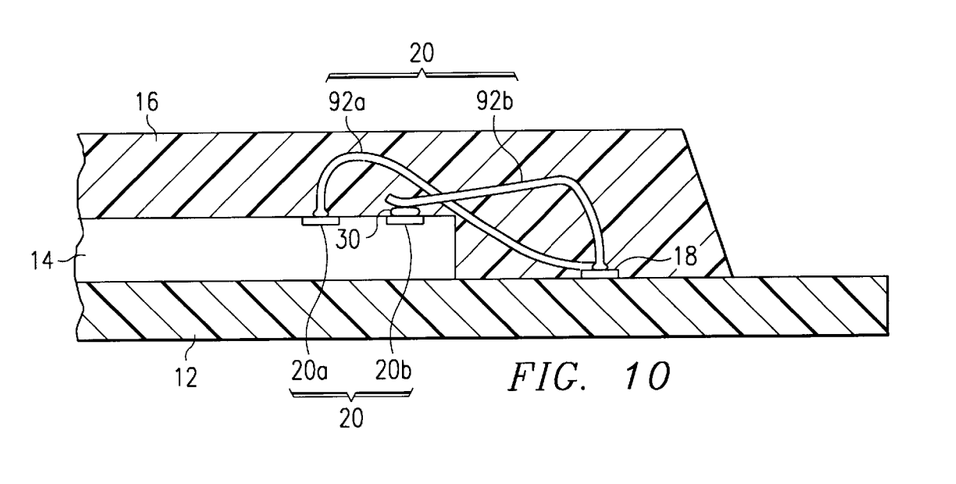
Figure 11:
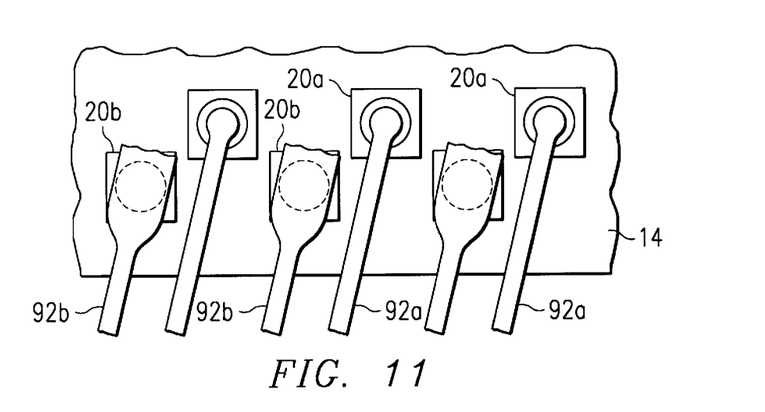
FIG. 11 Enlarged cross-section of principal section of FIG. 9

FIGS. 9 through 11 illustrate a BGA type semiconductor device pertaining to a second preferred embodiment of the conductive wire bonding method that pertains to this invention. Absent any specific explanation, each structural portion of the figure is numbered identically to the first preferred embodiment. In summary, in this preferred embodiment, in semiconductor device 90, instead of using stud bump stack 28, connection of conductive wire 92a in relation to inside bonding pad 20a is achieved through ordinary bonding technique wherein inside pads 20a are the beginning. In other words, as specifically articulated in FIGS. 10 and 11, the beginning of conductive wire 92a, which connects inner pad 20a with land 18 on top of the substrate, is connected to inside pad 20a, then pulled out to describe a loop, and its end is connected to the corresponding land 18 to complete the connection. On the other hand, for conductive wire 92b that connects outside pad 20b with land 18 similarly to the previous preferred embodiment, its beginning is connected to the land 18 that corresponds to the outside pad 20 and, after pulling out to describe a loop, its end is connected to stud bump 30 on top of outside pad 20b, to complete the connection.

As shown in FIG. 11, the end of conductive wire 92b that has been connected to outside pad 20b, similarly to the previous explanation, is flattened when severed and fans out into a flat shape. However, in this preferred embodiment, since the beginning of conductive wire 92a is connected to inner pad 20a, the tip of conductive wire 92a does not fan out in relation to bonding pad 20a. For this reason, the danger that neighboring conductive wires 92 would come into contact becomes slight.

Figure 12A:
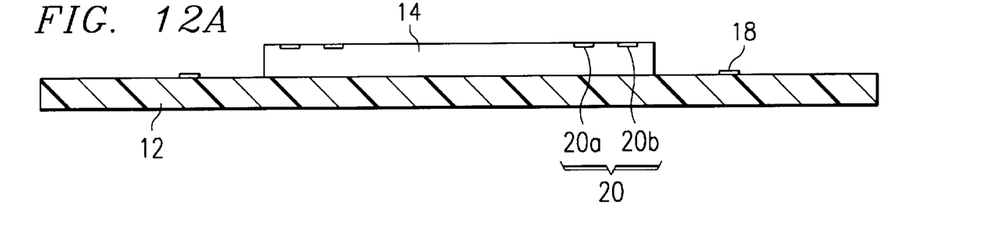
FIG. 12 Illustrates a semiconductor manufacturing process pertaining to a second preferred embodiment of this invention FIG. 13 Illustrates a semiconductor manufacturing process pertaining to a second preferred embodiment of this invention FIG. 14 Illustrates a semiconductor manufacturing process pertaining to a second preferred embodiment of this invention FIGS. 15A and 15B Illustrate cross-section and plan views of a lead frame type packaged device pertaining to an embodiment of the invention.
Figure 12B:
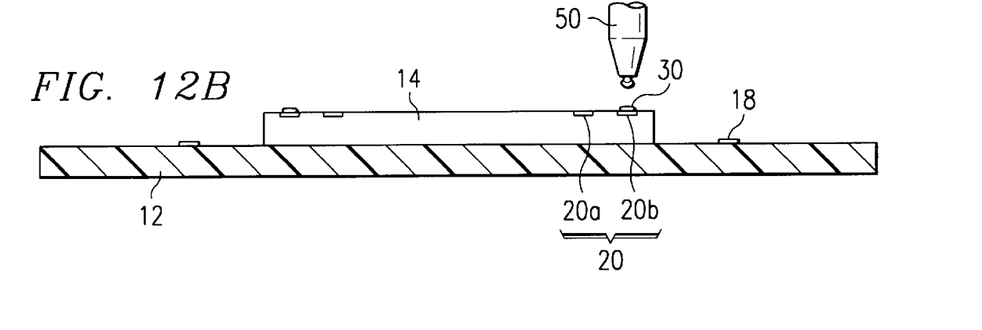

FIGS. 12A through 14 illustrate the assembly process for semiconductor devices pertaining to the second preferred embodiment. In FIG. 12A, semiconductor chip 14 is affixed to a specific position on insulated substrate 12 through an adhesive coated onto the back surface of semiconductor chip 14. In an ideal example of this embodiment, insulated substrate 12 would be supplied in the form of polyimide or other flexible insulated film and multiple semiconductor chips 14 would be mounted continuously. Next, in FIG. 12B, a single level of stud bumps 30 is formed using capillary 50 on outside pads 20b only.

Figure 12C:
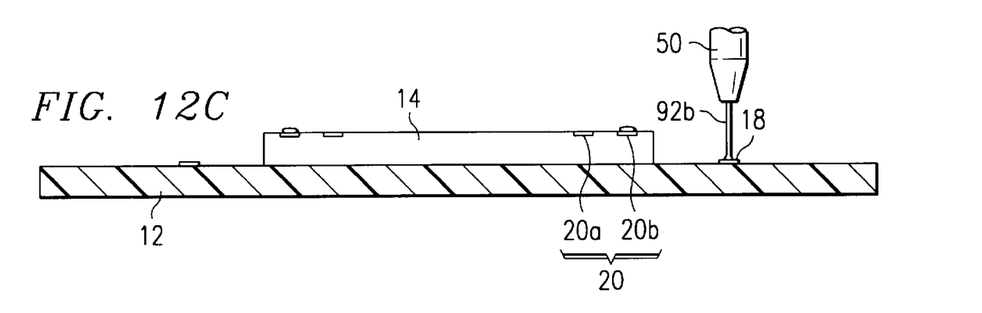
Figure 13A:
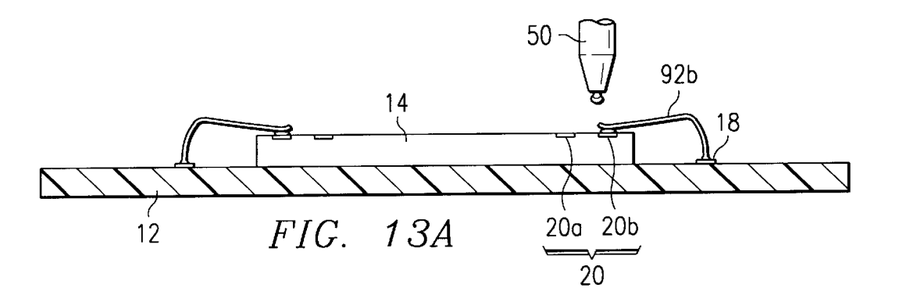

Next, in FIG. 12C the process to connect outside pads 20b with the corresponding lands 18 is performed. In this process, capillary 50 is lowered onto land 18 on insulated substrate 12, the ball at the top of the conductive wire 92b is pressed down, and after rapidly pulling it up to a specified height, a loop is described and capillary 50 is then moved to the corresponding outside pad 20b. Capillary 50 is pressed down to slightly flatten conductive wire 92b on top of stud bump 30 on outside pad 20b, and next, by pulling it up, conductive wire 92b is separated from capillary 50. This is performed successively on the outside pads 20b that correspond to the lands 18 (in other words, every other bonding pad), until the initial bonding process is complete, as illustrated in FIG. 13A.

Figure 13B:
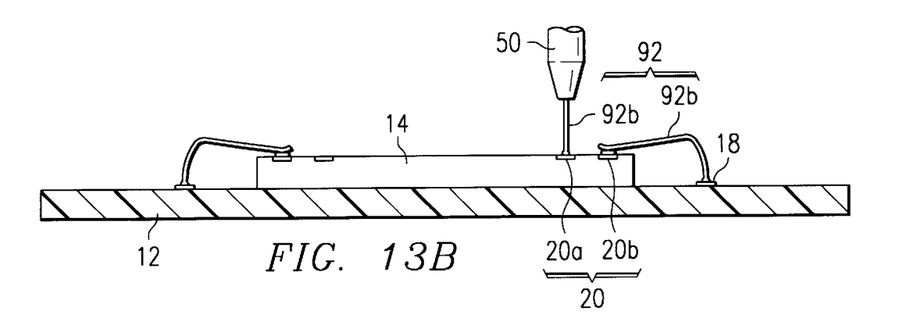

Next, the process shown in FIG. 13B is performed to connect the remaining bonding pads, in other words, insides pad 20a are connected with the corresponding lands 18 on the insulated substrate 12. In this process, firstly, an ordinary bonding process is performed wherein the beginning of conductive wire 92a is bonded to inside pad 20a. In other words, capillary 50 is lowered onto inside pad 20a, the ball at the tip of conductive wire 92a is pressed down, and after rapidly pulling up capillary 50 to a specified height, a loop is described and capillary 50 is pressed down on top of the corresponding land 18 to slightly flatten conductive wire 92a, so that when it is next lifted up, conductive wire 92a is separated from capillary 50. Through the above processes, as illustrated in FIG. 13C, wire bonding for all the bonding pads 20 is completed.

Figure 13C:
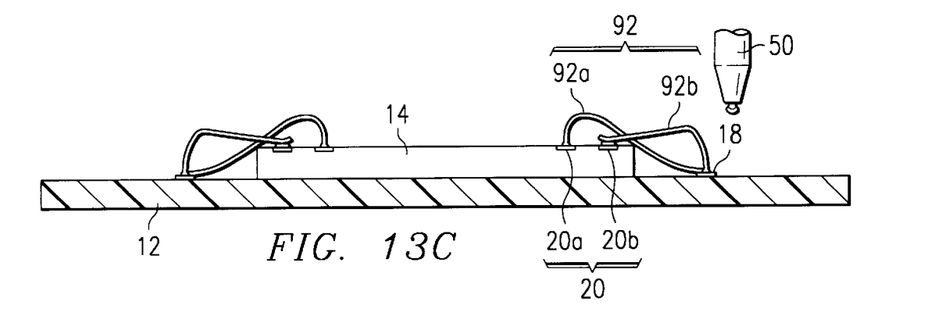
Figure 14:
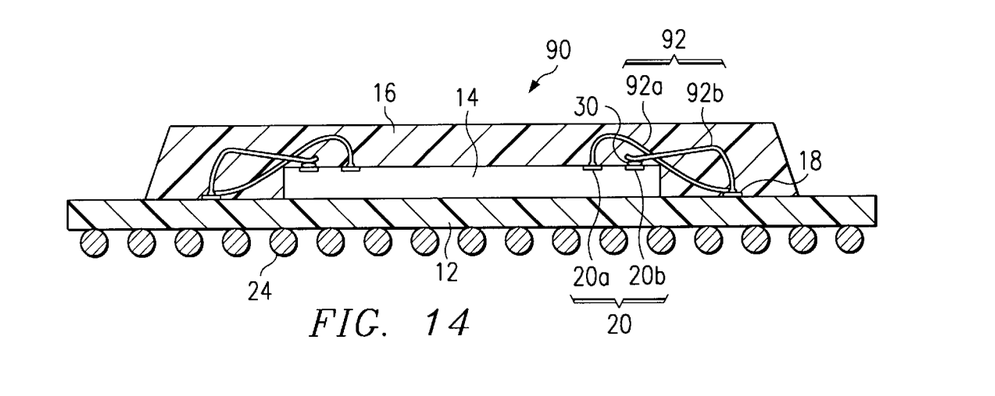

Subsequent to the above bonding process shown in FIG. 13C, in the process shown in FIG. 14, insulated substrate 12 which has been mounted with semiconductor chip 14 is placed in the mold as is in its film form. Next, through the introduction of resin molding 16 into said mold, the entire outline region of the surface of the insulated substrate including semiconductor chip 14 and conductive wire 92 is covered, and the external shape of the semiconductor package 90 is formed. In this preferred embodiment, a rising protuberance of conductive wire 92a on top of inside pad 20a is necessarily formed, so the thickness of this package cannot be reduced as much as in the previous preferred embodiment, but since there is no rising protuberance of conductive wire 92b on top of outside pad 20b, conductive wire 92a can be placed comparatively lower on top of the above inside pad 20a. In other words, similarly to existing staggered rows, it is not necessary to adopt the same height as the rising protuberance for conductive wire 92a on top of inside pad 20a in order to avoid contact with the apex of conductive wire 92b on top of outside pad 20b.

After that, solder ball 24 is moved to the position of the through hole on the back surface of the insulated substrate as the external connection terminal, and affixed after reflow. Using a punch tool, the package is punched out from the insulated film and finally semiconductor package 90 is obtained.

Figure 15A:
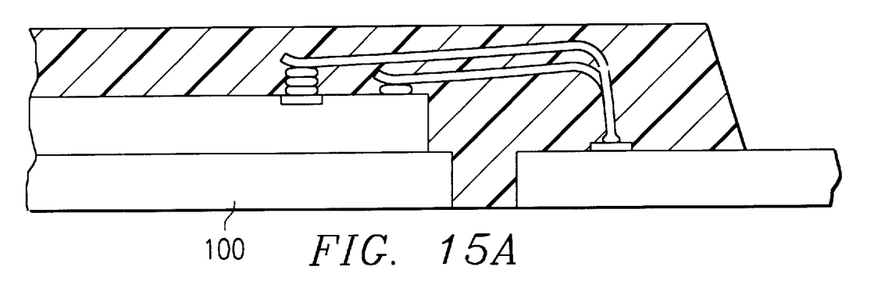
Figure 15B:
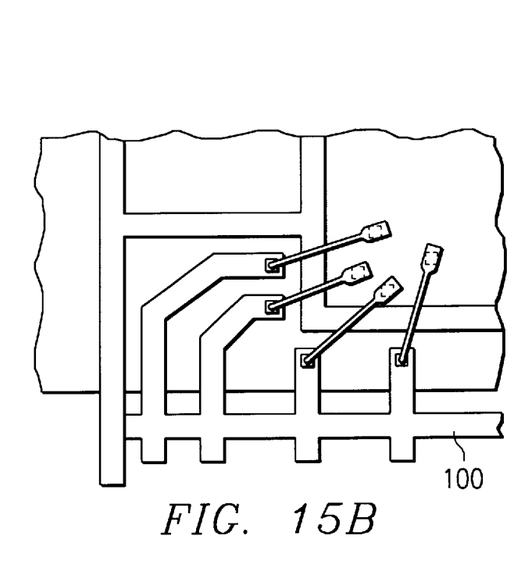

The above represents an explanation of the preferred embodiments of this invention with reference to the figures. However, it is important to note that the claims of this invention may be interpreted according to the claims of this patent without limitation to the items illustrated in the above preferred embodiments. The preferred embodiments illustrated an example of this invention adapted for use in a BGA type semiconductor device, and further as examples of general application, adapted for use in bonding two semiconductor chips. However, this invention is potentially adaptable for use in a package that utilizes a lead frame 100 (in FIGS. 15A and 15B), for example, QFP (Quad Flat Package).

Advantageous Effect of the Invention: Through this invention as described above, advantages of the reduction in pitch between bonding pads on the semiconductor chip based on the staggered row line-up can be reaped, while the thickness of the semiconductor package can also be reduced.

What is claimed is:

1. A semiconductor device comprising:
   a semiconductor chip comprising multiple bonding pads located in staggered rows on its edges;
   a substrate mounted with the semiconductor chip and comprising multiple lands connected electrically to the above multiple bonding pads;
   a bump portion formed on top of a bonding pad that is located on the inner side of the semiconductor chip;
   a first conductive wire wherein the beginning is connected to a land and the end is connected to a bonding pad that is located on the outer side of the semiconductor chip;
   a second conductive wire wherein the beginning is connected to a land and the end is connected to said bump on said bonding pad located on the inner side of the semiconductor chip; and
   resin affixing the semiconductor chip, said first conductive wire, and said second conductive wire.

2. A semiconductor device according to claim 1 wherein the bump portion on the bonding pad located on the inner side of the semiconductor chip consists of a stud bump stack comprised of two or more stud bumps stacked together.

3. A semiconductor device according to claim 1 wherein the height of the bump portion on the bonding pad located on the inner side of the semiconductor chip is greater than or equal to 60 microns from the front surface of the semiconductor chip.

4. A semiconductor device according to claim 1 comprising a single stud bump formed on the bonding pad located on the outer side of the semiconductor chip.

5. A semiconductor device according to claim 1 wherein the second conductive wire is formed in a higher position than the first conductive wire.

6. A semiconductor device comprising:
   a semiconductor chip comprising multiple bonding pads located in staggered rows on its edges;
   multiple lands connected electrically to the multiple bonding pads;
   a bump portion formed on top of a bonding pad that is located on the inner side of the semiconductor chip;
   a first conductive wire wherein the beginning is connected to a land and the end is connected to a bonding pad that is located on the outer side of the semiconductor chip;
   a second conductive wire wherein the beginning is connected to a land and the end is connected to said bump on said bonding pad located on the inner side of the semiconductor chip; and
   resin affixing the semiconductor chip, said first conductive wire, and said second conductive wire.

7. A semiconductor device according to claim 6 wherein multiple lands are formed on top of another semiconductor chip.

8. A semiconductor device according to claim 7 wherein the bump portion on the bonding pad located on the inner side of the semiconductor chip consists of a stud bump stack comprised of two or more stud bumps stacked together.

9. A semiconductor device according to claim 7 comprised of a single stud bump formed on the bonding pad located on the outer side of the semiconductor chip.

10. A semiconductor device according to claim 7 wherein the second conductive wire is formed in a higher position than the first conductive wire.

11. A semiconductor device according to claim 6 wherein multiple lands are formed in the inner lead portion of a lead frame.

12. A semiconductor device according to claim 11 wherein the bump portion on the bonding pad located on the inner side of the semiconductor chip consists of a stud bump stack comprised of two or more stud bumps stacked together.

13. A semiconductor device according to claim 11 comprised of a single stud bump formed on the bonding pad located on the outer side of the semiconductor chip.

14. A semiconductor device according to claim 11 wherein the second conductive wire is formed in a higher position than the first conductive wire.

15. A semiconductor device according to claim 6 wherein the bump portion on the bonding pad located on the inner side of the semiconductor chip consists of a stud bump stack comprised of two or more stud bumps stacked together.

16. A semiconductor device according to claim 6 comprised of a single stud bump formed on the bonding pad located on the outer side of the semiconductor chip.

17. A semiconductor device according to claim 6 wherein the second conductive wire is formed in a higher position than the first conductive wire.

18. A semiconductor device comprising:
   a semiconductor chip comprising multiple bonding pads located in staggered rows on its edges;
   a substrate mounted with the semiconductor chip and comprising multiple lands connected electrically to the multiple bonding pads;
   a first conductive wire wherein the beginning is connected to a land and the end is connected to a bonding pad that is located on the outer side of the semiconductor chip;
   a second conductive wire wherein the beginning is connected to a bonding pad located on the inner side of the semiconductor chip and the end is connected to a land; and
   resin affixing the semiconductor chip, said first conductive wire, and said second conductive wire.

* * * * *